US012585225B2

(12) United States Patent
Lee

(10) Patent No.: US 12,585,225 B2
(45) Date of Patent: Mar. 24, 2026

(54) WATERPROOF STRUCTURE AND ELECTRONIC DEVICE COMPRISING SAME

(71) Applicant: Samsung Electronics Co., Ltd.,
Suwon-si (KR)

(72) Inventor: Jaechul Lee, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 361 days.

(21) Appl. No.: 18/341,258

(22) Filed: Jun. 26, 2023

(65) Prior Publication Data

US 2023/0333512 A1     Oct. 19, 2023

Related U.S. Application Data

(63) Continuation of application No.
PCT/KR2022/002547, filed on Feb. 22, 2022.

(30) Foreign Application Priority Data

Feb. 22, 2021     (KR) ........................ 10-2021-0023481

(51) Int. Cl.
*G04B 37/10*          (2006.01)
*F16J 15/16*          (2006.01)
(Continued)

(52) U.S. Cl.
CPC ............ *G04B 37/106* (2013.01); *F16J 15/16*
(2013.01); *H01H 13/06* (2013.01); *H01H*
*13/14* (2013.01); *H05K 5/069* (2013.01)

(58) Field of Classification Search
CPC . G04B 37/106; F16J 15/16; F16J 15/56; F16J
15/3236; H01H 13/06; H01H 13/14;
(Continued)

(56) References Cited

U.S. PATENT DOCUMENTS

| 5,521,890 | A | | 5/1996 | Miche et al. |
| 5,540,450 | A | * | 7/1996 | Hayashi ............. H01R 13/5205 |
| | | | | 174/152 G |

(Continued)

FOREIGN PATENT DOCUMENTS

| CN | 209103109 U | 7/2019 |
| EP | 1 169 584 B1 | 1/2002 |

(Continued)

OTHER PUBLICATIONS

Korean Office Action dated Feb. 10, 2025, issued in Korean
Application No. 10-2021-0023481.
(Continued)

*Primary Examiner* — Edwin A. Leon
(74) *Attorney, Agent, or Firm* — Jefferson IP Law, LLP

(57)          ABSTRACT

An electronic device is provided. The electronic device
includes a body having a passage, a physical button having
a rod passing through the passage, an inner surface having
a first convex surface and a second convex surface formed
to be spaced apart from the first convex surface, a through-
hole formed by the inner surface, an outer surface having a
third convex surface and a protruding surface formed to be
spaced apart from the third convex surface, a bottom surface
formed between the inner surface and the outer surface, and
a waterproof member having a fourth convex surface formed
in the direction facing the bottom surface, wherein the
waterproof member is arranged between the body and the
rod.

20 Claims, 11 Drawing Sheets

(51) Int. Cl.
| | |
|---|---|
| *H01H 13/06* | (2006.01) |
| *H01H 13/14* | (2006.01) |
| *H05K 5/06* | (2006.01) |

(58) Field of Classification Search
    CPC .......... H01H 9/04; H05K 5/069; G04G 17/00;
                    G04G 17/02; G04G 17/04; G04G 21/00;
                    G04G 21/08; G06F 1/163; G06F 1/1656;
                                                    G06F 1/1671
    See application file for complete search history.

(56) References Cited

U.S. PATENT DOCUMENTS

| | | | |
|---|---|---|---|
| 6,200,020 B1 | 3/2001 | Rieben | |
| 7,540,655 B2 | 6/2009 | Speichinger | |
| 7,553,186 B2 * | 6/2009 | Morikawa .......... | H01R 13/5208 |
| | | | 439/587 |
| 9,086,717 B2 * | 7/2015 | Meerovitsch ........ | G04B 37/106 |
| 9,933,071 B2 | 4/2018 | Ryther et al. | |
| 2001/0004337 A1 | 6/2001 | Paratte | |
| 2002/0115345 A1 * | 8/2002 | Nakamura ......... | H01R 13/5208 |
| | | | 439/587 |
| 2005/0007891 A1 | 1/2005 | Hiranuma et al. | |
| 2005/0042906 A1 * | 2/2005 | Tabata ............... | H01R 13/5205 |
| | | | 439/274 |
| 2011/0235476 A1 | 9/2011 | Hiranuma | |
| 2012/0104749 A1 | 5/2012 | Kang | |
| 2013/0062173 A1 | 3/2013 | Kang | |
| 2013/0330951 A1 | 12/2013 | Yudate | |
| 2014/0233359 A1 * | 8/2014 | Ishida .................... | H01H 13/06 |
| | | | 368/290 |
| 2016/0381820 A1 | 12/2016 | Arao | |
| 2017/0003655 A1 | 1/2017 | Ely | |
| 2017/0118319 A1 | 4/2017 | Jun et al. | |
| 2018/0248987 A1 | 8/2018 | Cha et al. | |
| 2018/0261408 A1 | 9/2018 | Kim et al. | |
| 2018/0358190 A1 | 12/2018 | Lee et al. | |
| 2019/0072905 A1 | 3/2019 | Loetscher | |
| 2019/0101870 A1 | 4/2019 | Pandya et al. | |
| 2020/0374611 A1 | 11/2020 | Kim et al. | |

FOREIGN PATENT DOCUMENTS

| | | |
|---|---|---|
| EP | 2 688 152 B1 | 1/2014 |
| JP | H6-213326 A | 8/1994 |
| JP | 2002-198387 A | 7/2002 |
| JP | 2002-531838 A | 9/2002 |
| JP | 2005-30765 A | 2/2005 |
| JP | 5437875 B2 | 3/2014 |
| JP | 6591635 B2 | 10/2019 |
| KR | 95-0015013 A | 6/1995 |
| KR | 10-2003-0086657 A | 11/2003 |
| KR | 10-1155020 B1 | 6/2012 |
| KR | 10-1266704 B1 | 5/2013 |
| KR | 10-2013-0122669 | 11/2013 |
| KR | 10-2015-0026648 | 3/2015 |
| KR | 10-2015-0089316 A | 8/2015 |
| KR | 10-2017-0046542 A | 5/2017 |
| KR | 10-2017-0123906 A | 11/2017 |
| KR | 10-2017-0133228 | 12/2017 |
| KR | 10-2018-0098037 A | 9/2018 |
| KR | 10-1993073 B1 | 6/2019 |
| KR | 10-2039436 A | 11/2019 |
| KR | 10-2020-0027010 | 3/2020 |

OTHER PUBLICATIONS

International Search Report dated Jun. 9, 2022, issued in International Patent Application No. PCT/KR2022/002547.
Extended European Search Report dated May 21, 2024, issued in European Patent Application No. 22756595.9.
Korean Notice of Patent Grant dated Aug. 21, 2025, issued in Korean Patent Application No. 10-2021-0023481.

* cited by examiner

320

310

1010

300

1200

350

360

397

370

380

395

390

355

393

$$
130 \begin{cases} 131 \\ 132 \\ 133 \\ 134 \end{cases} \qquad 131 \begin{cases} 131a \\ 131b \\ 131c \\ 131d \end{cases} \qquad 132 \begin{cases} 132a \\ 132b \\ 132c \\ 132d \end{cases}
$$

WATERPROOF STRUCTURE AND ELECTRONIC DEVICE COMPRISING SAME

CROSS-REFERENCE TO RELATED APPLICATION(S)

This application is a continuation application, claiming priority under § 365(c), of an International application No. PCT/KR2022/002547, filed on Feb. 22, 2022, which is based on and claims the benefit of a Korean patent application number 10-2021-0023481, filed on Feb. 22, 2021, in the Korean Intellectual Property Office, the disclosure of which is incorporated by reference herein in its entirety.

BACKGROUND

1. Field

The disclosure relates to a waterproof structure and an electronic device including the same. More particularly, the disclosure relates to a waterproof structure for improving a waterproof performance of an electronic device and improving a click feeling of key buttons, and an electronic device including the same.

2. Description of Related Art

An electronic device may include at least one or more keys and sensors. At least one or more keys may be disposed on a front surface, rear surface, or lateral surface of a housing of the electronic device, respectively.

A waterproof member may be formed by using a mold. Users may carry electronic devices. The environment in which electronic devices operate may variously change depending on users' external activities and the like, and electronic devices may be exposed to contamination by water or foreign materials.

The above information is presented as background information only to assist with an understanding of the disclosure. No determination has been made, and no assertion is made, as to whether any of the above might be applicable as prior art with regard to the disclosure.

SUMMARY

When a waterproof member having an O-ring structure is manufactured with a mold, a parting line may be formed on a close-contact line of a waterproof member in charge of waterproofing, thereby causing a problem of degraded waterproof performance. Moreover, the O-ring structure may have a problem in that, if a key button makes a straight movement or a straight reciprocating movement, the waterproof member may be twisted due to the characteristics of the circular shape, thereby degrading the click feeling of the key button.

Aspects of the disclosure are to address at least the above-mentioned problems and/or disadvantages and to provide at least the advantages described below. Accordingly, an aspect of the disclosure is to provide a waterproof structure for improving the waterproof performance of an electronic device and improving the click feeling of key buttons, and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a body having a passage, a physical button including a rod extending through the passage, and a waterproof member including an inner surface which includes a first convex surface and a second convex surface formed to have a gap with the first convex surface, a penetration hole formed by the inner surface, an outer surface including a third convex surface and a protruding surface formed to have a gap with the third convex surface, a lower surface formed between the inner surface and the outer surface, and a fourth convex surface formed in a direction opposite to the lower surface, wherein the waterproof member is disposed between the body and the rod, wherein the rod is inserted through the penetration hole, wherein the waterproof member is disposed such that the first convex surface and the second convex surface are in close contact with the rod, and wherein the third convex surface and the protruding surface are in close contact with one surface of the body.

In accordance with another aspect of the disclosure, a waterproof member is provided. The waterproof member includes an inner surface which includes a first convex surface and a second convex surface formed to have a gap with the first convex surface, a penetration hole formed by the inner surface, an outer surface including a third convex surface and a protruding surface formed to have a gap with the third convex surface, a lower surface formed between the inner surface and the outer surface, and a fourth convex surface formed in a direction opposite to the lower surface.

Various embodiments disclosed herein may provide a waterproof structure for preventing inflow of water or foreign materials into an electronic device and improving the waterproof performance thereof, and an electronic device including the same.

In addition, various embodiments disclosed herein may provide a waterproof structure for improving the manipulation feeling related to key button pressing, and an electronic device including the same.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
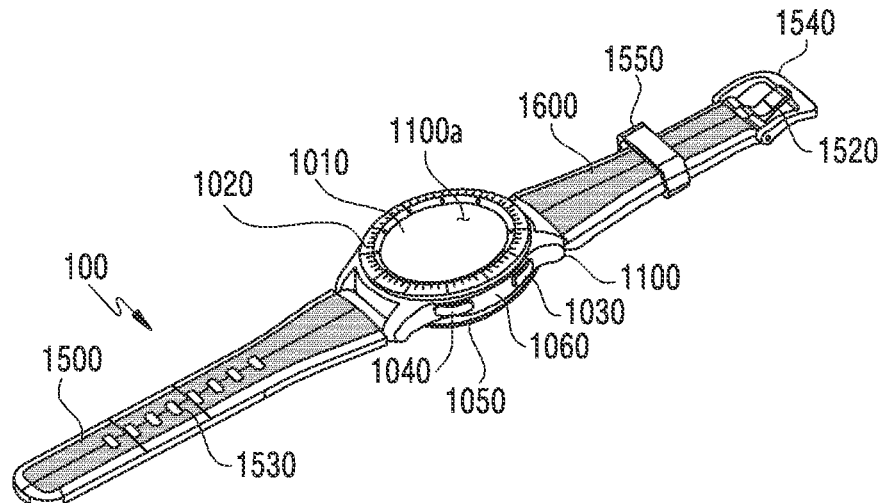
FIG. 1 is a front perspective of a mobile electronic device according to an embodiment of the disclosure.

FIG. 1 is a front perspective of a mobile electronic device 100 according to an embodiment of the disclosure.

Figure 2:
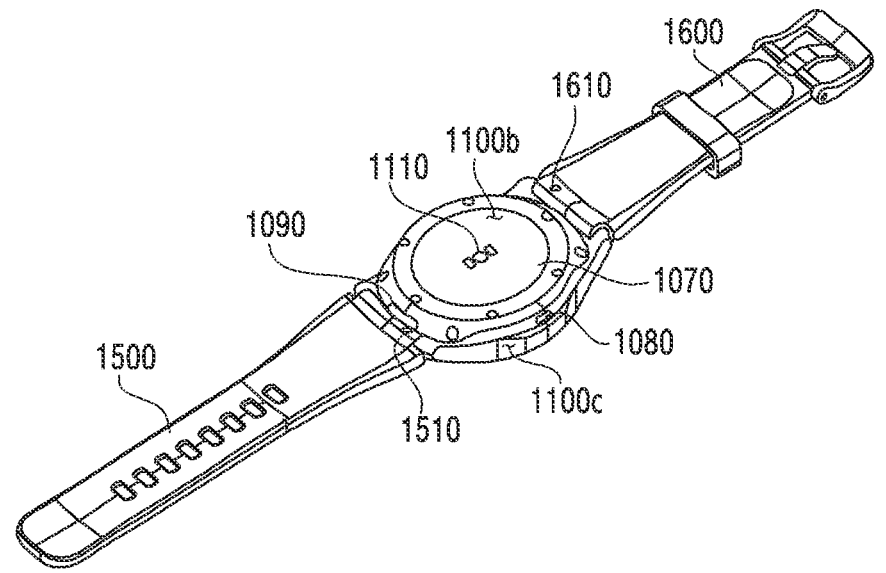
FIG. 2 is a rear perspective view of an electronic device in FIG. 1 according to an embodiment of the disclosure.

FIG. 2 is a rear perspective view of an electronic device 100 in FIG. 1 according to an embodiment of the disclosure.

Referring to FIGS. 1 and 2, an electronic device 100 according to an embodiment may include a housing 1100 including a first surface (or a front surface) 1100*a*, a second surface (or a rear surface) 1100*b*, and a side surfaces 1100*c* surrounding a space between the first surface 1100*a* and the second surface 1100*b*, and binding members 1500 and 1600, each of which is connected to at least a portion of the housing 1100 and which are configured such that the electronic device 100 is detachably worn on a part (e.g., wrist, ankle, etc.) of a user's body. In one embodiment (not shown), a housing may also be referred to as a structure which forms a part of the first surface 1100*a* in FIG. 1, the second surface 1100*b*, and the side surfaces 1100*c*. According to yet an embodiment, the first surface 1100*a* may be formed by a front plate 1010 (e.g., a glass plate including various coating layers, or a polymer plate) of which at least a portion is substantially transparent. The second surface 1100*b* may, for example, be formed by a substantially opaque rear plate 1070. For example, the rear plate 1070 may be formed by coated or colored glass, ceramic, polymer, metal (e.g., aluminum, stainless steel (STS), or magnesium), or a combination of at least two of above materials. The side surfaces 1100*c* may be coupled to the front plate 1010 and the rear plate 1070, and may be formed by a lateral bezel structure (or a "lateral member") 1060 including metal and/or polymer. In other embodiments, the rear plate 1070 and the lateral bezel structure 1060 may be integrally formed, and may include the same material (e.g., a metal material such as aluminum). The binding members 1500 and 1600 may be formed of various materials and in various shapes. Each of the binding members may, for example, be formed in an integral shape, and may be formed to have multiple unit links coupled to be movable to each other, by woven fabrics, leather, rubber, urethane, metal, ceramic, or a combination of at least two of the materials.

According to another embodiment, the electronic device 100 may include at least one of a display 1200 (see FIG. 3), an audio module 1050 or 1080, a sensor module 1110, a key input device 1020, 1030, or 1040, and a connector hole 1090. In another embodiment, the electronic device 100 may be configured such that at least one (e.g., the key input device 1020, 1030, or 1040, the connector hole 1090, or the sensor module 1110) of elements is omitted therefrom, or other elements are additionally included therein.

For example, the display 1200 may be exposed through a substantial portion of the front plate 1010. In another example, the shape of the display 1200 may be a shape corresponding to the shape of the front plate 1010, and may have various shapes such as a circle, an ellipse, or a polygon. In yet another example, the display 1200 may be coupled to or disposed adjacent to a touch detection circuit, a pressure sensor capable of measuring the intensity (pressure) of a touch, and/or a fingerprint sensor.

The audio modules 1050 and 1080 may include a microphone hole (i.e., the audio module 1050) and a speaker hole (i.e., the audio module 1080). The microphone hole (i.e., the audio module 1050) may have a microphone disposed therein in order to obtain external sound, and in some embodiments, multiple microphones may be arranged to be able to detect the direction of sound. The speaker hole (i.e., the audio module 1080) may be used as an external speaker and a receiver for a phone call. In some embodiments, the speaker hole (i.e., the audio module 1080) and the microphone hole (i.e., the audio module 1050) may be implemented as one hole, or a speaker (e.g., a piezo speaker) may be included therein without the speaker hole (i.e., the audio module 1080).

In an embodiment, the sensor module 1110 may generate an electrical signal or a data value corresponding to an internal operation state of the electronic device 100 or an external environmental state. For example, the sensor module 1110 may include a biometric sensor module 1110 (e.g., a heart rate monitor (HRM) sensor) disposed on the second surface 1100*b* of the housing 1100. The electronic device 100 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, an illuminance sensor, and the like.

The key input devices 1020, 1030, and 1040 may include a wheel key (i.e., key input device 1020) which is disposed on the first surface 1100*a* of the housing 1100 and is rotatable in at least one direction, and/or side key buttons (i.e., key input devices 1020 and 1030) arranged on the side surface 1100*c* of the housing 1100. In an embodiment, the wheel key may have a shape corresponding to the shape of the front plate 1010. In another embodiment, the electronic device 100 may not include a part or the whole of key input device 1020, 1030, or 1040 mentioned above, and the key input device 1020, 1030, or 1040 not included therein may be implemented as a different type such as a soft key, on the display 1200. In yet another embodiment, the connector hole 1090 may include other connector holes (not shown) capable of accommodating a connector (for example, a universal serial bus (USB) connector) for transmitting or receiving electric power and/or data to or from an external electronic device, and capable of accommodating a connector for transmitting or receiving an audio signal to or from an external electronic device. The electronic device 100 may further include a connector cover (not shown) for covering at least a part of the connector hole 1090 and blocking external foreign substances from being introduced into the connector hole.

In an embodiment, the binding members 1500 and 1600 may be detachably bound to at least a partial area of the housing 1100 by using locking members 1510 and 1610. In another embodiment, the binding members 1500 and 1600 may include one or more of a fixation member 1520, a fixation member fastening hole 1530, a band guide member 1540, and a band fixation ring 1550.

In yet another embodiment, the fixation member 1520 may be configured such that the housing 1100 and the binding members 1500 and 1600 are fixed to a part (e.g., wrist, ankle, etc.) of a user's body. The fixation member fastening hole 1530 may be formed to correspond to the fixation member 1520 so that the housing 1100 and the binding members 1500 and 1600 are fixed to a part of a user's body. In still another embodiment, the band guide member 1540 may be configured to limit the range of motion of the fixation member 1520 in case that the fixation member 1520 is fastened to the fixation member fastening hole 1530, and thus the binding members 1500 and 1600 may be in close contact with and be bound to a part of a user's body. The band fixation ring 1550 may, for example, limit the motion range of the binding members 1500 and 1600 in a state where the fixation member 1520 and the fixation member fastening hole 1530 are fastened to each other.

Figure 3:
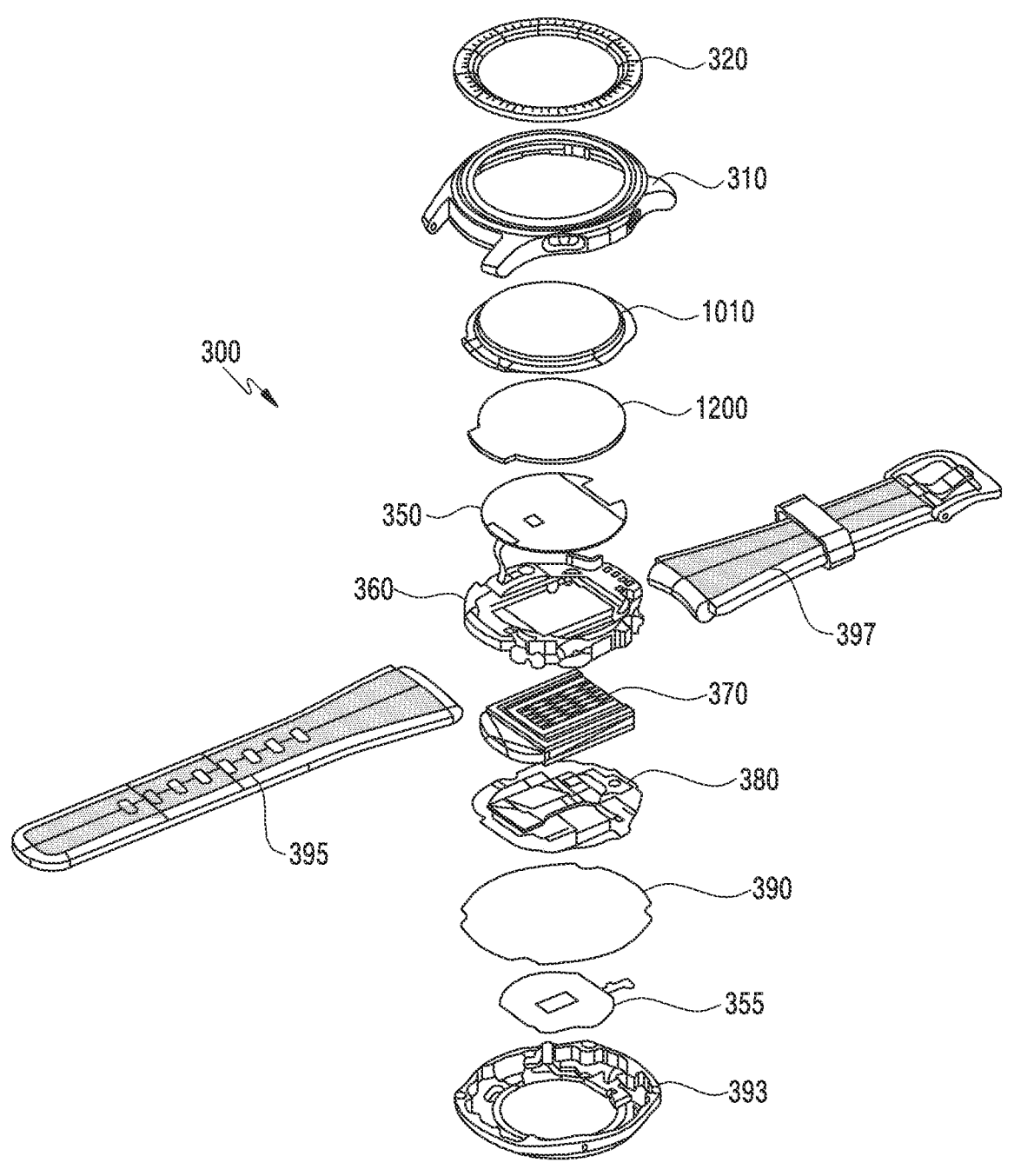
FIG. 3 is an exploded perspective view of an electronic device in FIG. 1 according to an embodiment of the disclosure.

FIG. 3 is an exploded perspective view of an electronic device 300 according to an embodiment of the disclosure.

An electronic device 300 in FIG. 3 may refer to the electronic device 100 in FIGS. 1 and 2. In connection with elements identical or substantially identical to the foregoing elements, the same terms or same reference numerals may be used, and overlapping descriptions thereof may be omitted.

Referring to FIG. 3, an electronic device 300 may include a lateral bezel structure 310, a wheel key 320, a front plate 1010, a display 1200, a first antenna 350, a second antenna 355, a support member 360 (e.g., a bracket), a battery 370, a printed circuit board 380, a sealing member 390, a rear plate 393, and binding members 395 and 397. At least one of elements of the electronic device 300 may be the same as or similar to at least one of elements of the electronic device 100 in FIG. 1 or 2, and overlapping descriptions thereof will be omitted hereinafter. In an embodiment, the support member 360 may be disposed inside the electronic device 300 to be connected to the lateral bezel structure 310, or may be integrally formed with the lateral bezel structure 310. For example, the support member 360 may be formed of a metal material and/or a non-metal (e.g., polymer) material. In another embodiment, the support member 360 may have one surface to which the display 1200 is coupled, and the other surface to which the printed circuit board 380 is coupled. The printed circuit board 380 may have a processor, a memory, and/or an interface, which are mounted thereon. For example, the processor may include one or more of a central processing device, an application processor, a graphic processing unit (GPU), an application processor sensor processor, a communication processor, and the like.

According to one embodiment, for example, the memory may include a volatile memory or a non-volatile memory. For example, the interface may include a high definition multimedia interface (HDMI), a universal serial bus (USB) interface, a secure digital (SD) card interface, and/or an audio interface. In another example, the interface may electrically or physically connect the electronic device 300 to an external electronic device, and may include a USB connector, an SD card/multimedia card (MMC) connector, or an audio connector.

According to another embodiment, the battery 370 may be a device for supplying electric power to at least one element of the electronic device 300, and for example, may include a non-rechargeable primary cell, a rechargeable secondary cell, or a fuel cell. At least a part of the battery 370 may, for example, be disposed on substantially the same plane as the printed circuit board 380. The battery 370 may also be integrally disposed inside the electronic device 100, or may also be disposed to be detachable/attachable from/to the electronic device 100.

According to yet another embodiment, the first antenna 350 may be disposed between the display 1200 and the support member 360. For example, the first antenna 350 may include a near field communication (NFC) antenna, a wireless charging antenna, and/or a magnetic secure transmission (MST) antenna. In another example, the first antenna 350 may perform a short-range communication with an external device, or may wirelessly transmit and receive electric power required for charging, and may transmit a short-range communication signal or a magnetic-based signal including payment data. In still another embodiment, an antenna structure may be formed by a part of the lateral bezel structure 310 and/or the support member 360, or a combination thereof.

In an embodiment, the second antenna 355 may be disposed between the printed circuit board 380 and the rear plate 393. In an example, the second antenna 355 may include a near field communication (NFC) antenna, a wireless charging antenna, and/or a magnetic secure transmission (MST) antenna. In another example, the second antenna 355 may perform a short-range communication with an external device, or may wirelessly transmit and receive electric power required for charging, and may transmit a short-range communication signal or a magnetic-based signal including payment data. In another embodiment, an antenna structure may be formed by a part of the lateral bezel structure 310 and/or the rear plate 393, or a combination thereof.

According to yet another embodiment, the sealing member 390 may be disposed between the lateral bezel structure 310 and the rear plate 393. The sealing member 390 may, for example, block moisture and foreign substances from being introduced from the outside into a space surrounded by the lateral bezel structure 310 and the rear plate 393.

Figure 4:
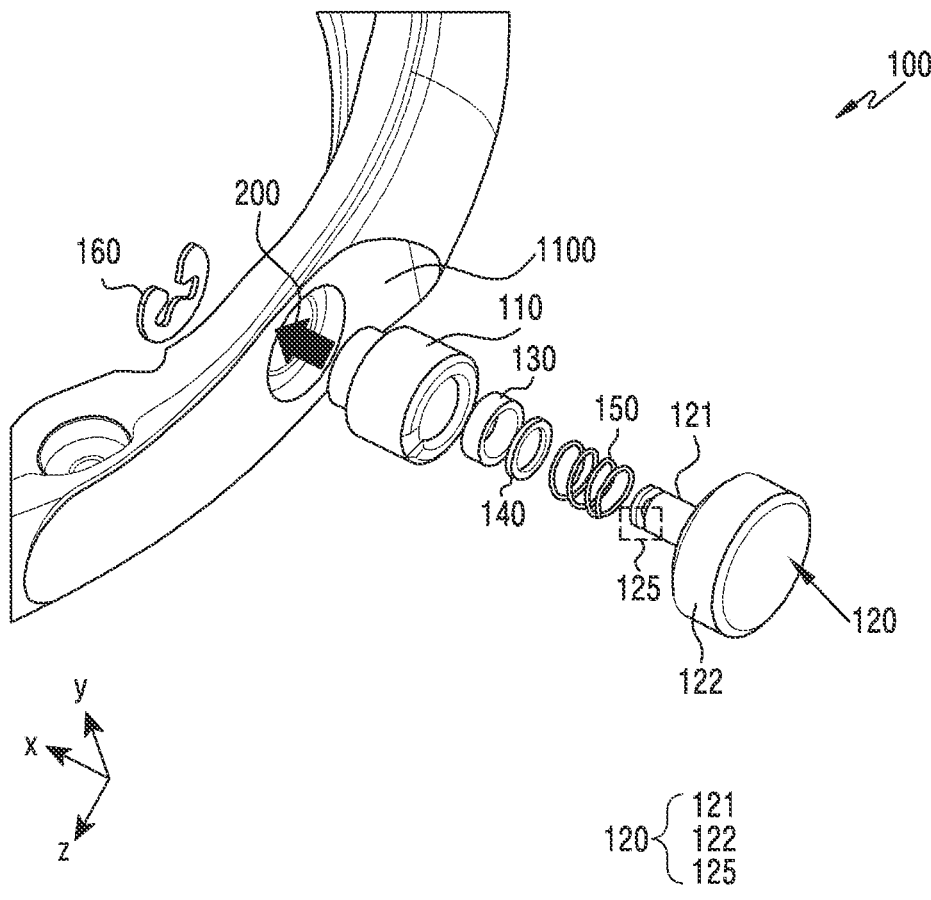
FIG. 4 is a perspective view showing an exploded configuration of an electronic device according to an embodiment of the disclosure.

FIG. 4 is a perspective view showing an exploded configuration of an electronic device 100 according to an embodiment of the disclosure.

An electronic device 100 in FIG. 4 may refer to the electronic device 100 in FIGS. 1 and 2 or the electronic device 300 in FIG. 3. In connection with elements identical or substantially identical to the foregoing elements, the same terms or same reference numerals may be used, and over-lapping descriptions may be omitted.

Referring to FIG. 4, the electronic device 100 may include a housing 1100, a body 110, a physical button 120 including a rod 121, a waterproof member 130, a washer 140, and an elastic member 150. The configuration of the electronic device 100 is not limited thereto. In an example, the housing 1100 and the body 110 may also be integrally formed. According to some embodiments, the electronic device 100 may also be configured such that at least one of elements described above is omitted therefrom or at least one other element is further included therein. According to another embodiment, the electronic device 100 may also be config-ured such that the washer 140 is omitted therefrom or other elements are included therein. According to yet another embodiment, the electronic device 100 may also further include a switch member (not shown) disposed inside the electronic device 100 and disposed on one end of the rod 121.

According to one embodiment, the housing 1100 may include an opening. The opening may be formed to be opened to the outside of the electronic device 100. The opening may have a circular shape. The shape of the opening is not limited thereto. The body 110 may be accommodated in the opening.

According to another embodiment, the body 110 may be coupled to the opening of the housing 1100 by using an adhesive member. According to yet another embodiment, the body 110 may include a passage having an open end formed to be opened to the outside of the electronic device 100. According to still another embodiment, the passage may have a cylindrical shape. However, the shape of the passage is not limited thereto.

In an embodiment, the physical button 120 may include a rod 121 and a button part 122. The rod 121 and the button part 122 may be integrally formed. The configuration thereof is not be limited thereto. In an example, the rod 121 and the button part 122 may be formed as separate members. The rod 121 and the button part 122 may also be coupled using an adhesive member. The rod 121 may be formed to protrude in the X-axis direction 200 on one surface of the button part 122. According to another embodiment, the rod 121 may have a cylindrical shape.

According to yet another embodiment, the elastic member 150, the washer 140, and the waterproof member 130 may be sequentially inserted around the rod 121. The configu-ration of the electronic device 100 is not limited thereto. For example, the electronic device 100 may also be configured such that at least one of elements described above is omitted therefrom or at least one other element is further included therein. According to still another embodiment, the elec-tronic device 100 may also be configured such that the washer 140 is omitted therefrom or other elements are included therein. The rod 121, around which the elastic member 150, the washer 140, and the waterproof member 130 are inserted, may be inserted into the passage of the body 110 in the X-axis direction 200.

The electronic device 100 may further include a fixation member 160. The fixation member 160 may allow the rod 121 inserted in the body 110 to be fixed to the electronic device 100. The fixation member 160 may, for example, be coupled to the rod 121 so that the rod 121 is fixed to the electronic device 100. According to an embodiment, the rod 121 may include a binding groove 125. The binding groove 125 may be formed on the outer circumferential surface of the rod. At least a part of the fixation member 160 may be accommodated in the binding groove 125 of the rod 121.

According to another embodiment, the fixation member 160 may be supported by the inner wall of the housing 1100 in a state of being fastened to the binding groove 125. For example, in a state where the rod 121 is inserted in the passage of the body 110, the fixation member 160 may be fastened thereto, and thus the physical button 120 may be restricted to the housing 1100. According to still another embodiment, the fixation member 160 may include an E-ring shape or a C-ring shape. The shapes of the fixation member 160 and the rod 121 are not limited thereto. For example, the fixation member 160 may also include a nut shape, and the rod 121 may also include a bolt shape.

Figure 5:
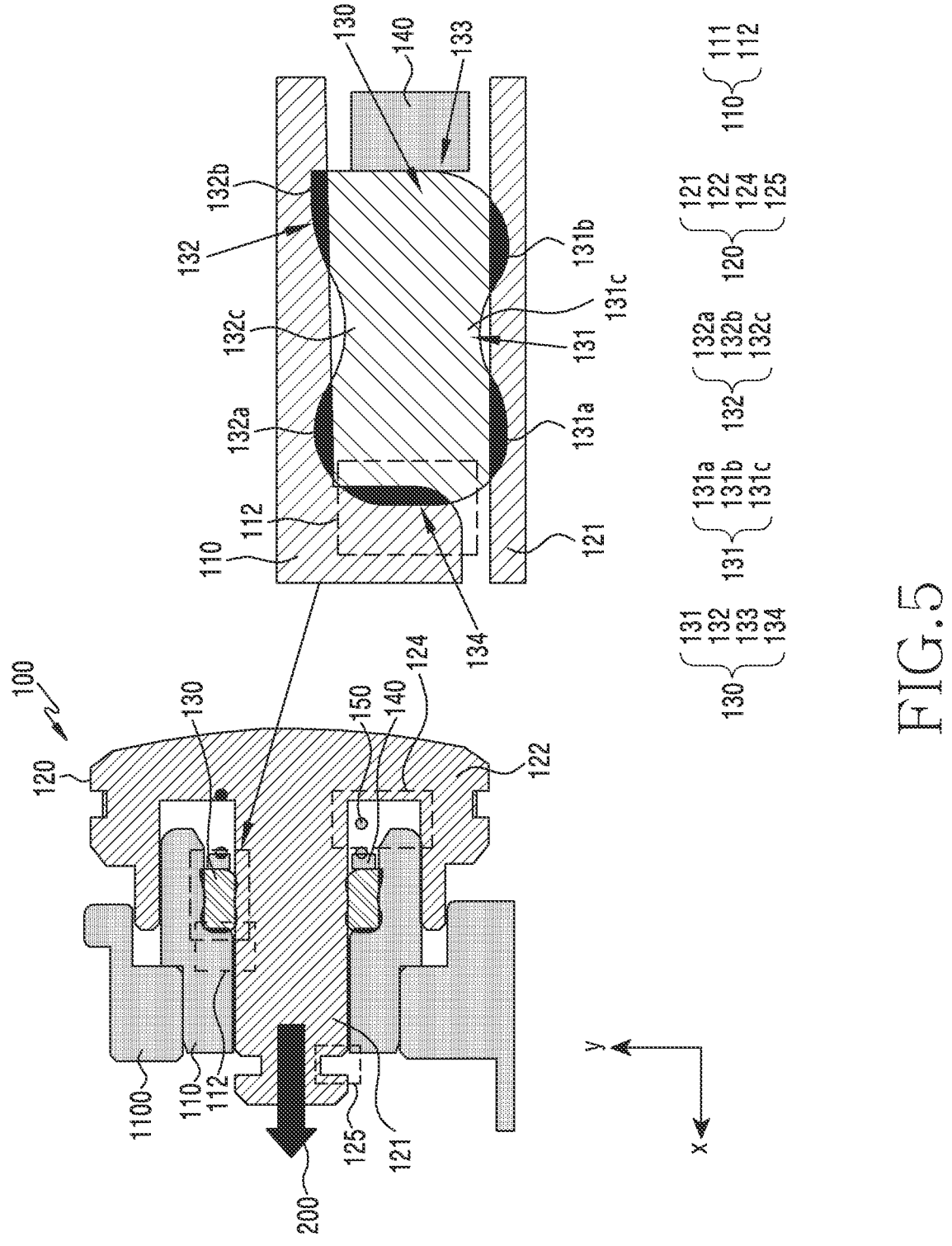
FIG. 5 is a cross-sectional view showing a configuration of an electronic device according to an embodiment of the disclosure.

FIG. 5 is a cross-sectional view showing a configuration of an electronic device 100 according to an embodiment of the disclosure.

The configuration of the electronic device 100 may refer to the configuration in FIG. 4. In connection with elements identical or substantially identical to the foregoing elements, the same terms or same reference numerals may be used, and overlapping descriptions may be omitted.

Referring to FIG. 5, a body 110 may be inserted into an opening of a housing 1100 in an X-axis direction 200. In an embodiment, the opening of the housing 1100 may be formed in a circular shape. The shape of the opening is not limited to the circular shape. The shape of the outer surface of the body 110 may be formed to correspond to the shape of the opening. According to another embodiment, the body 110 and the housing 1100 may be coupled using an adhesive member. According to yet another embodiment, the body 110 and the housing 1100 may also be integrally formed.

According to still another embodiment, the body 110 may include a passage having an open end formed to be opened to the outside of the electronic device 100. The passage may be configured such that the diameter the passage is enlarged in a direction toward the open end of the body 110. The passage may, for example, include a step surface configuring a step 112 by which the diameter of the passage is enlarged. In a state where the rod 121 is inserted in the passage of the body 110, a space may be formed between one surface of the passage, of which the diameter is enlarged, and the rod 121. A waterproof member 130, a washer 140, and an elastic member 150 may be arranged in the formed space.

According to one embodiment, the housing 1100 may include a recessed groove in which at least a part of a groove 124 thereof may be accommodated. The recessed groove may also be formed in the body 110. The recessed groove may be a gap formed between the body 110 and the housing 1100.

According to another embodiment, the rod 121 may be inserted into the passage in the X-axis direction 200. In a state where the rod 121 is inserted in the passage, the physical button 120 may perform linear motion or linear reciprocating motion in the X-axis direction 200 by pressing the button part 122. In case that the physical button 120 performs linear motion or linear reciprocating motion, the physical button 120 may operate the switch member.

According to yet another embodiment, the button part 122 may include the groove 124 surrounding the rod. The shape of the button part 122 is not limited thereto. For example, the button part 122 may also include a dome structure disposed to face the outside of the electronic device 100.

According to still another embodiment, the waterproof member 130 may include an inner surface 131, an outer surface 132, a penetration hole surrounded by the inner surface 131, a lower surface 133, and one surface formed in the direction opposite to the lower surface. The penetration hole surrounded by the inner surface 131 may have a shape corresponding to the cross-sectional shape of the rod 121. In an example, the penetration hole may have a circular shape. According to another embodiment, each of the inner surface 131 and the outer surface 132 of the waterproof member 130 may include at least one protruding part. In an embodiment, the protruding part may be formed in a convex surface shape. The inner surface 131 of the waterproof member 130 may include a first convex surface 131*a* and a second convex surface 131*b*. In another embodiment, the first convex surface 131*a* and the second convex surface 131*b* may be formed to have an interval. According to an embodiment, the inner surface 131 may further include a first concave surface 131*c* formed between the first convex surface 131*a* and the second convex surface 131*b*. The first concave surface 131*c* may be connected to the first convex surface 131*a* and the second convex surface 131*b* through a curved surface. In yet another embodiment, the outer surface 132 may include a third convex surface 132*a* and a protruding surface 132*b*. The third convex surface 132*a* and the protruding surface 132*b* may be formed to have an interval. According to still another embodiment, the outer surface 132 may further include a second concave surface 132*c* formed between the third convex surface 132*a* and the protruding surface 132*b*. The second concave surface 132*c* may be connected to the third convex surface 132*a* and the protruding surface 132*b* through a curved surface.

In an embodiment, the first convex surface 131*a* may be formed in a direction opposite to the third convex surface 132*a*. The second convex surface 131*b* may be formed in a direction opposite to the protruding surface 132*b*. The first concave surface 131*c* may be formed in a direction opposite to the second concave surface 132*c*. In another embodiment, the one surface thereof opposite to the lower surface 133 may include a fourth convex surface 134.

In yet another embodiment, the fourth convex surface 134 may be connected to the first convex surface 131*a* and the third convex surface 132*a* through a curved surface. In still another embodiment, the lower surface 133 may include a flat surface. The flat surface may be formed as a surface substantially perpendicular to the X-axis direction 200 in which the rod is inserted. The lower surface 133 including the flat surface may, for example, be connected to the second convex surface 131*b* through a curved surface.

According to an embodiment, the protruding surface 132*b* and the lower surface 133 may form a boundary. The protruding surface 132*b* may include a convex surface shape cut along the boundary. The protruding surface 132*b* may, for example, be cut along the boundary, and thus an edge may be formed. The protruding surface 132*b* may be formed as a seamless curved surface, which is curved, together with the second concave surface 132*c* from the boundary as a starting point. According to another embodiment, the protruding surface 132*b* may also include a flat surface. The flat surface may be formed on an edge part of the protruding surface 132*b*. The flat surface of the protruding surface 132*b* may also be parallel to the one surface of the body 110, which faces the flat surface. According to still another embodiment, the flat surface may also be formed as a surface substantially perpendicular to the lower surface 133. The protruding surface 132*b* may, for example, be formed as a seamless curved surface, which is curved, together with the second concave surface 132*c* along the flat surface from the boundary as a starting point. In another example, the protruding surface 132*b* may include a convex surface. The protruding surface 132*b* may be formed as a seamless curved surface, which is curved, together with the second concave surface 132*c* along the convex surface from the boundary as a starting point.

The waterproof member 130 may be disposed between the body 110 and the rod 121. The rod 121 may be inserted through the penetration hole of the waterproof member 130. In an embodiment, the waterproof member 130 may seal between the body 110 and the rod 121. The waterproof member 130 may block foreign substances from being introduced from the outside of the housing 1100 to the inside of the housing 1100 through at least one opening of the housing 1100. In another embodiment, the waterproof member 130 may be disposed to be in close contact with the rod 121 along the first convex surface 131*a* and the second convex surface 131*b*. The waterproof member 130 may be disposed to be in close contact with the one surface of the body 110 along the third convex surface 132*a* and the protruding surface 132*b*. In yet another embodiment, by the elastic force of the elastic member 150 disposed between the groove 124 of the physical button 120 and the step surface, the fourth convex surface 134 may be in close contact with the step surface having the step 112 formed thereon. Areas, which are in close contact with the rod 121, may be formed on the first convex surface 131*a* and the second convex surface 131*b*. In an example, the areas, which are in close contact with the rod 121, may seal between the waterproof member 130 and the rod 121 while maintaining a state of being pressed between the waterproof member 130 and the rod 121 by the elastic force. In still another embodiment, an area in which the first convex surface 131*a* and the rod 121 are in close contact with each other, and an area in which the second convex surface 131*b* and the rod 121 are in close contact with each other may also be uniformly formed. Areas, which are in close contact with the one surface of the body 110, may be formed on the third convex surface 132*a* and the protruding surface 132*b*. In another example, the areas, which are in close contact therewith, may seal between the waterproof member 130 and the one surface of the body 110 while maintaining a state of being pressed between the waterproof member 130 and the one surface of the body 110 by the elastic force thereof. According to an embodiment, an area in which the third convex surface 132*a* and one surface of the body 110 are in close contact with each other, and an area in which the protruding surface 132*b* and one surface of the body 110 are in close contact with each other may also be formed uniformly. The configuration thereof is not be limited thereto. For example, the area in which the first convex surface 131*a* and the rod 121 are in close contact with each other, the area in which the second convex surface 131*b* and the rod 121 are in close contact with each other, the area in which the third convex surface 132*a* and the one surface of the body 110 are in close contact with each other, and the area in which the protruding surface 132*b* and the one surface of the body 110 are in close contact with each other may also be formed differently.

According to one embodiment, the waterproof member 130 may be configured to block foreign substances such as water or dust from being introduced into the electronic device 100 at a pressure of 5 atmospheric pressures or more.

According to another embodiment, the waterproof member 130 may be made of a rubber or silicon material. According to yet another embodiment, the waterproof member 130 is not limited to the rubber or silicone material, and may also be made of various materials, such as urethane, having elasticity. According to still another embodiment, the waterproof member 130 may also be made of a fluorine rubber or Teflon material.

The waterproof member 130 may be disposed such that the first concave surface 131*c* has a gap with the rod 121. A closed space may be formed between the first concave surface 131*c* and the rod 121 by the first convex surface 131*a* and the second convex surface 131*b*. In an embodiment, the waterproof member 130 may be disposed such that the second concave surface 132*c* has a gap with the one surface of the body 110. A closed space may, for example, be formed between the second concave surface 132*c* and the body 110 by the third convex surface 132*a* and the protruding surface 132*b*. In case that the waterproof member performs linear motion or linear reciprocating motion in the X-axis direction 200, the internal pressure of the closed space may increase. As the internal pressure increases, the closing force of the closed space may increase.

In an embodiment, the electronic device 100 may further include a support member facing the lower surface 133 of the waterproof member 130. The support member may be the washer 140. The washer 140 may include a penetration hole. In another embodiment, the washer 140 may include one surface which is a flat surface. The flat surface may include one surface parallel to the lower surface 133 of the waterproof member 130, which faces the one surface. The rod 121 may be inserted through the penetration hole of the washer 140. In yet another embodiment, the washer 140 may be disposed between the body 110 and the rod 121.

According to an embodiment, the elastic member 150 may be disposed between the body 110 and the rod 121. According to another embodiment, the elastic member 150 may include a spring or coil shape. According to yet another embodiment, one end of the elastic member 150 may be disposed on one surface of the washer 140, and the other end thereof may be disposed on one surface of the physical button 120. The elastic member 150 may, for example, transmit pressure to the waterproof member 130 by pressing the physical button 120 in the X-axis direction 200. In case that pressure is applied to the waterproof member 130, the fourth convex surface 134 of the waterproof member 130 may be in close contact with the step surface of the body. An area, which is in close contact with the step surface, may be formed on the fourth convex surface 134. The area, which is in close contact with the step surface, may seal between the waterproof member 130 and the step surface while maintaining a state of being pressed between the waterproof member 130 and the step surface by the elastic force thereof. According to one embodiment, the physical button 120 may perform linear motion or linear reciprocating motion in the X-axis direction 200 by the elastic force of the elastic member 150 (e.g., a spring or a coil). According to another embodiment, by pressing the physical button 120 in the X-axis direction 200, the elastic member 150 may be contracted. According to still another embodiment, by elasticity of the elastic member 150, the elastic member 150 may be expanded. In case that the elastic member 150 is expanded, the physical button 120 may move in the –X-axis direction.

Figure 6:
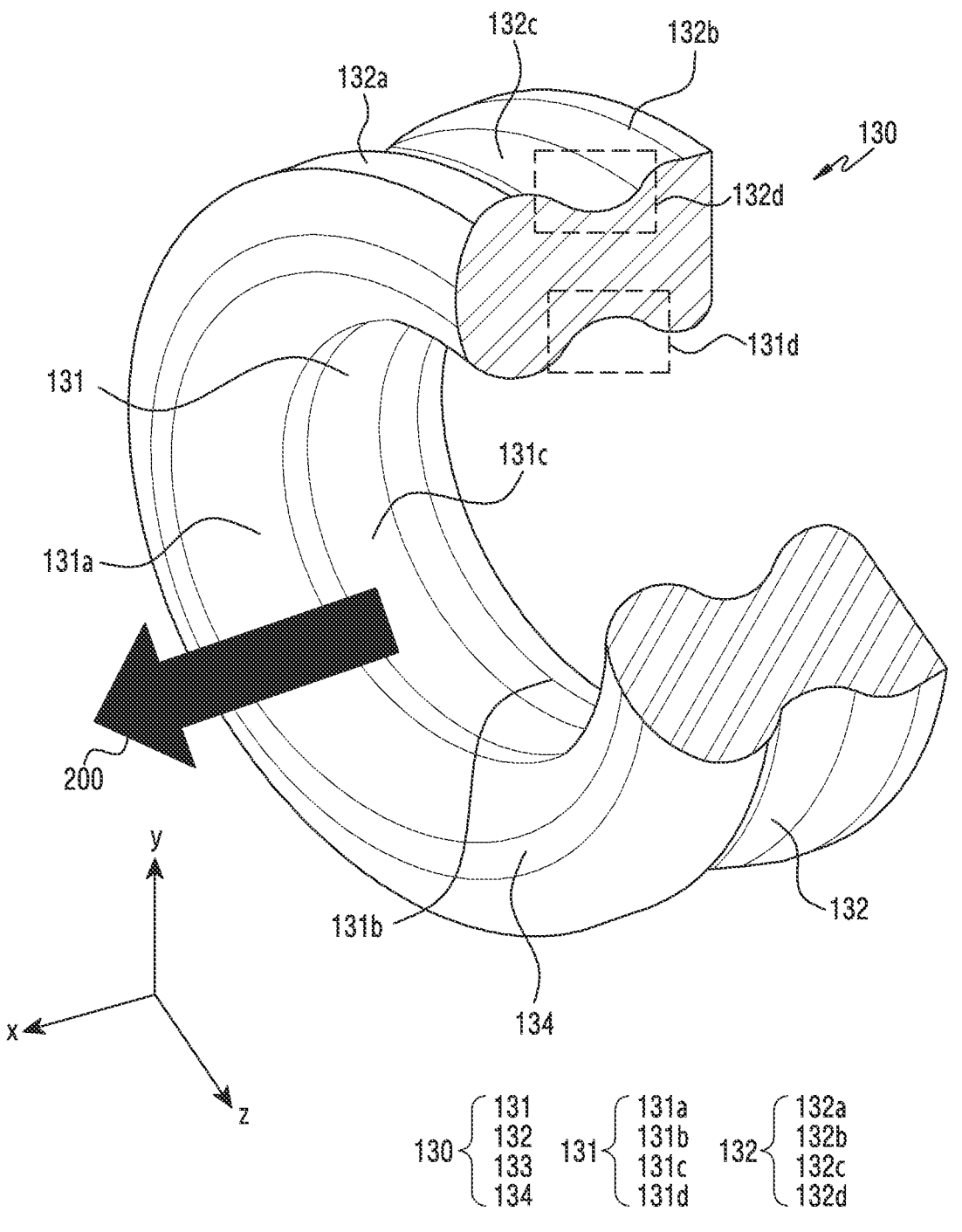
FIG. 6 is a perspective view showing a waterproof member according to an embodiment of the disclosure.

FIG. 6 is a perspective view showing a waterproof member 130 according to an embodiment of the disclosure.

Figure 7:
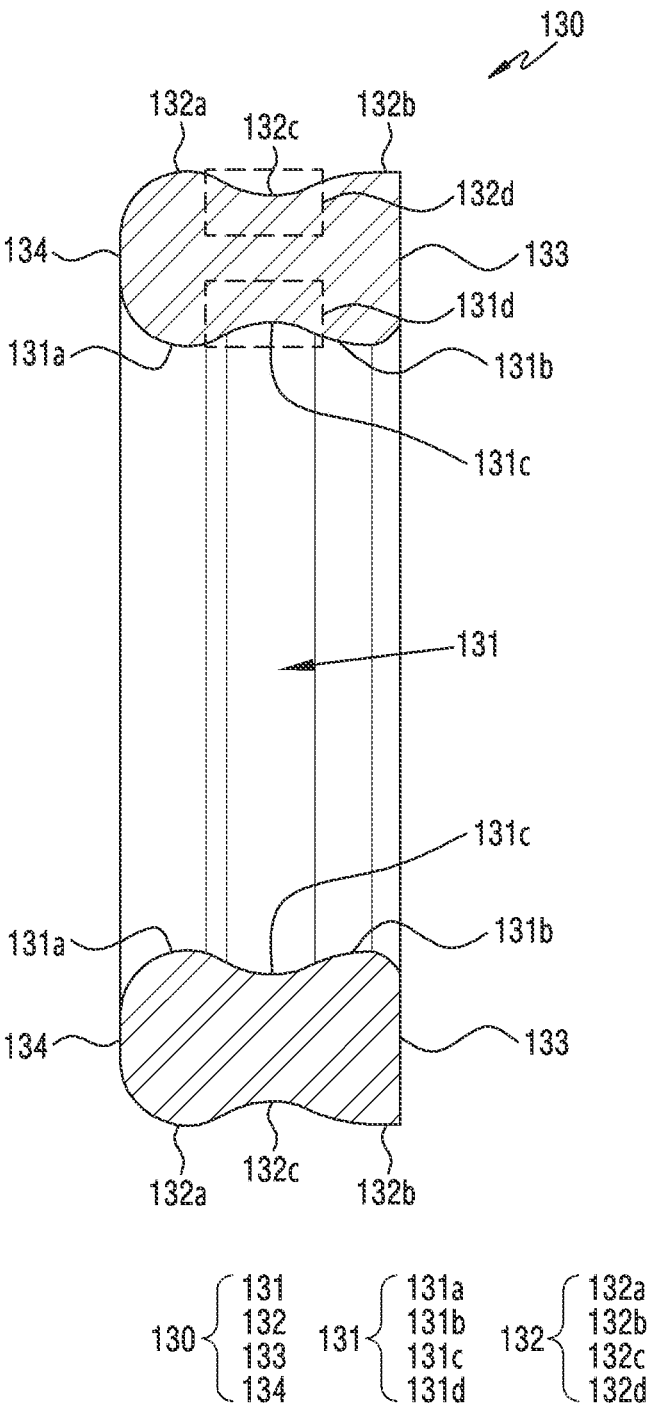
FIG. 7 is a cross-sectional view showing a waterproof member according to an embodiment of the disclosure.

FIG. 7 is a cross-sectional view showing a waterproof member 130 according to an embodiment of the disclosure.

The structure of the waterproof member 130 may refer to by the structure of the electronic device 100 in FIG. 5. In connection with elements identical or substantially identical to the foregoing elements, the same terms or same reference numerals may be used, and overlapping descriptions may be omitted.

Referring to FIGS. 6 and 7, a waterproof member 130 may have a shape of a tube or a ring including a circular penetration hole. An inner surface 131 of the waterproof member 130 may include a groove 131*d* or 132*d* formed in a direction toward an outer surface 132. The outer surface 132 of the waterproof member 130 may include a groove 131*d* or 132*d* formed in a direction toward the inner surface 131. The grooves 131*d* and 132*d* may be formed in a concave surface shape. Referring to FIGS. 6 and 7, the waterproof member 130 may be formed as a seamless curved surface curved along the outer surface 132, the fourth convex surface 134, the inner surface 131, and the lower surface 133 from the boundary, as a starting point, between the protruding surface 132*b* and the lower surface 133. Referring to FIGS. 5, 6, and 7, the inner surface 131 of the waterproof member 130 may include at least one close-contact surface which is in close contact with a rod (121 in FIG. 5). The close-contact surface may be the first convex surface 131*a* and the second convex surface 131*b*. The outer surface 132 of the waterproof member 130 may include at least one close-contact surface which is in close contact with one surface of a body (110 in FIG. 5). The close-contact surface may be the third convex surface 132*a* and the protruding surface 132*b*. In an embodiment, the waterproof member 130 may perform linear motion or linear reciprocating motion in the X-axis direction 200. Since at least two surfaces are in close contact with a rod (121 in FIG. 5) and one surface of a body (110 in FIG. 5), the shapes of the inner surface 131 and the outer surface 132 of the waterproof member 130 may prevent a phenomenon, in which the waterproof member 130 is twisted, in case that the waterproof member 130 performs linear motion or linear reciprocating motion. In case that the rod 121 is inserted into the penetration hole of the waterproof member 130, the shapes of the inner surface 131 and the outer surface 132 of the waterproof member 130 may also prevent a phenomenon in which the waterproof member 130 is twisted.

In another embodiment, the waterproof member 130 may also include a first O-ring part and a second O-ring part. The first O-ring part and the second O-ring part may be formed to have an interval. The inner surface of the first O-ring part may include the first convex surface 131*a*. In another embodiment, the outer surface of the first O-ring part may include the third convex surface 132*a*. The inner surface of the second O-ring part may include the second convex surface 131*b*. The outer surface of the second O-ring part may include the protruding surface 132*b*. A connection ring part may be formed between the first O-ring part and the second O-ring part. The first O-ring part and the second O-ring part may be integrally connected by the connection ring part. According to still another embodiment, the connection ring part may include an inner surface and an outer surface. The inner surface of the connection ring part may include the first concave surface 131*c*. The outer surface of the connection ring part may include a second concave surface 132*c*. In yet another embodiment, the first concave surface 131*c* may be connected to the first convex surface 131*a* and the second convex surface 131*b* through a curved surface. The second concave surface 132*c* may be connected to the third convex surface 132*a* and the protruding surface 132*b* through a curved surface. The second O-ring part may, for example, include the lower surface 133. According to an embodiment, the lower surface 133 may include a flat surface. The flat surface may be formed as a surface substantially perpendicular to the X-axis direction 200 in which the rod is inserted. According to an embodiment, the lower surface 133 including the flat surface may be connected to the second convex surface 131*b* through a curved surface.

In one embodiment, the protruding surface 132*b* and the lower surface 133 may form a boundary. The protruding surface 132*b* may include a shape in which the convex surface is cut along the boundary. The protruding surface 132*b* may be cut along the boundary, and thus an edge may be formed.

Figure 8:
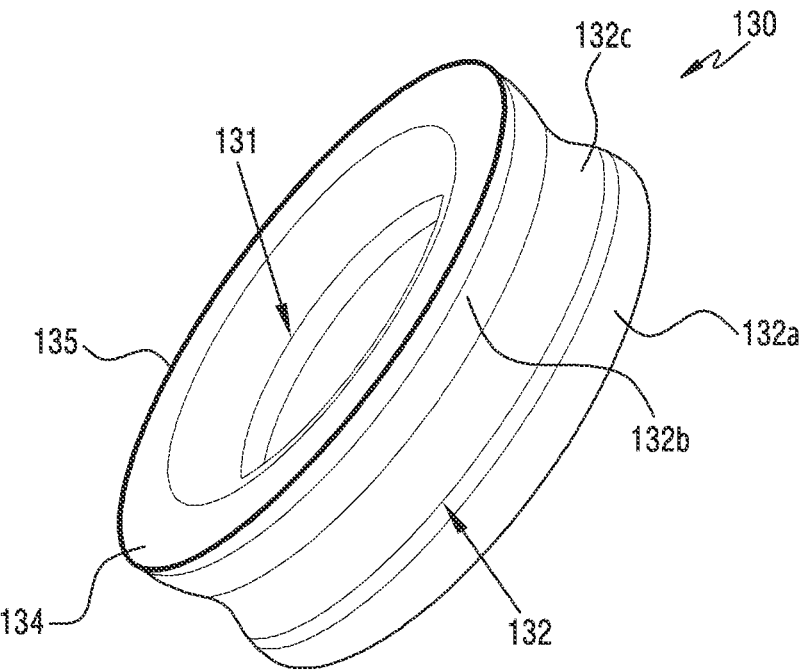
FIG. 8 is a perspective view showing a waterproof member according to an embodiment of the disclosure.

FIG. 8 is a perspective view showing a waterproof member 130 according to an embodiment of the disclosure.

Figure 9:
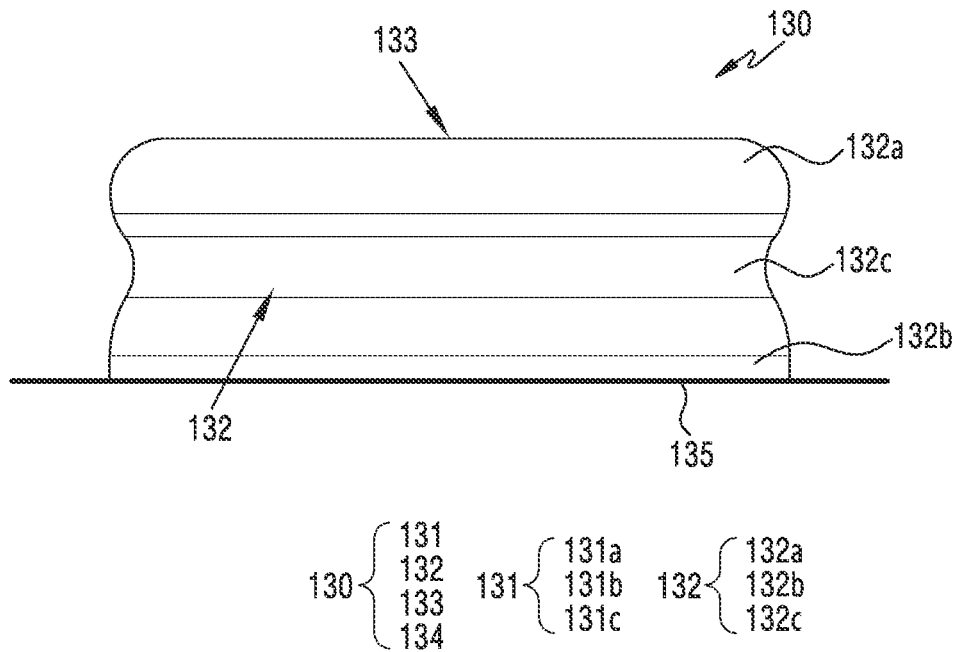
FIG. 9 is a front view showing a waterproof member according to an embodiment of the disclosure.

FIG. 9 is a front view showing a waterproof member 130 according to an embodiment of the disclosure.

The structure of the waterproof member 130 may refer to by the structure of the electronic device 100 in FIG. 5. In connection with elements identical or substantially identical to the foregoing elements, the same terms or same reference numerals may be used, and overlapping descriptions may be omitted.

According to one embodiment, a waterproof member 130 may be molded using a mold. Since the waterproof member 130 is molded using a mold, an outer surface 132 of the waterproof member 130 may include a parting line 135. Referring to FIGS. 8 and 9, the parting line 135 may be formed on a portion of the outer surface 132 other than a portion in which one surface of a body (110 in FIG. 5) and the waterproof member 130 are in close contact with each other. The parting line 135 may be formed at the outermost part of the protruding surface 132*b* along the boundary between the protruding surface 132*b* and the lower surface 133.

Figure 10:
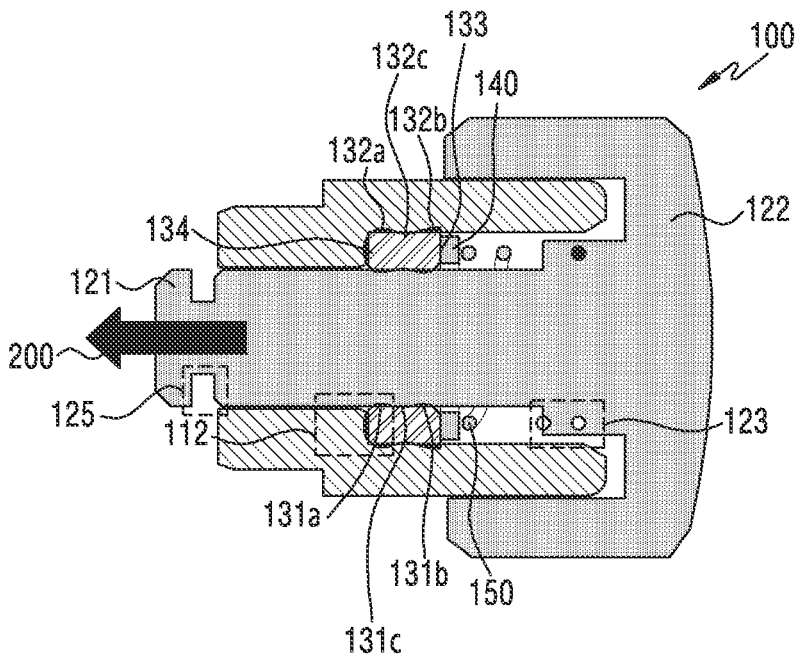
FIG. 10 is a cross-sectional view showing a configuration of an electronic device according to an embodiment of the disclosure.

FIG. 10 is a cross-sectional view showing a configuration of an electronic device according to an embodiment of the disclosure.

The structures of the housing 1100, the body 110, and the waterproof member 130 may refer to the structures of the electronic device 100 in FIG. 5. In connection with elements identical or substantially identical to the foregoing elements, the same terms or same reference numerals may be used, and overlapping descriptions may be omitted.

Referring to FIG. 10, according to an embodiment, a physical button 120 may further include a step surface having a step 123 formed on one end of a rod 121, on which a button part 122 and the rod 121 are in contact with each other. The step 123 may be formed so that the diameter of the rod is enlarged. In a state where the rod 121 is inserted in the passage of the body 110, a space may be formed between one surface of the passage, of which the diameter is enlarged, and the rod 121. A waterproof member 130, a washer 140, an elastic member 150, and the step surface may be disposed in the formed space. According to an embodiment, one end of the elastic member 150 may be disposed on one surface of the washer 140, and the other end of the elastic member 150 may be disposed on a step surface of the step 123. According to another embodiment, the step 123 may also include a recessed groove. The elastic member 150 may also be accommodated in and fixed to the recessed groove.

Figure 11:
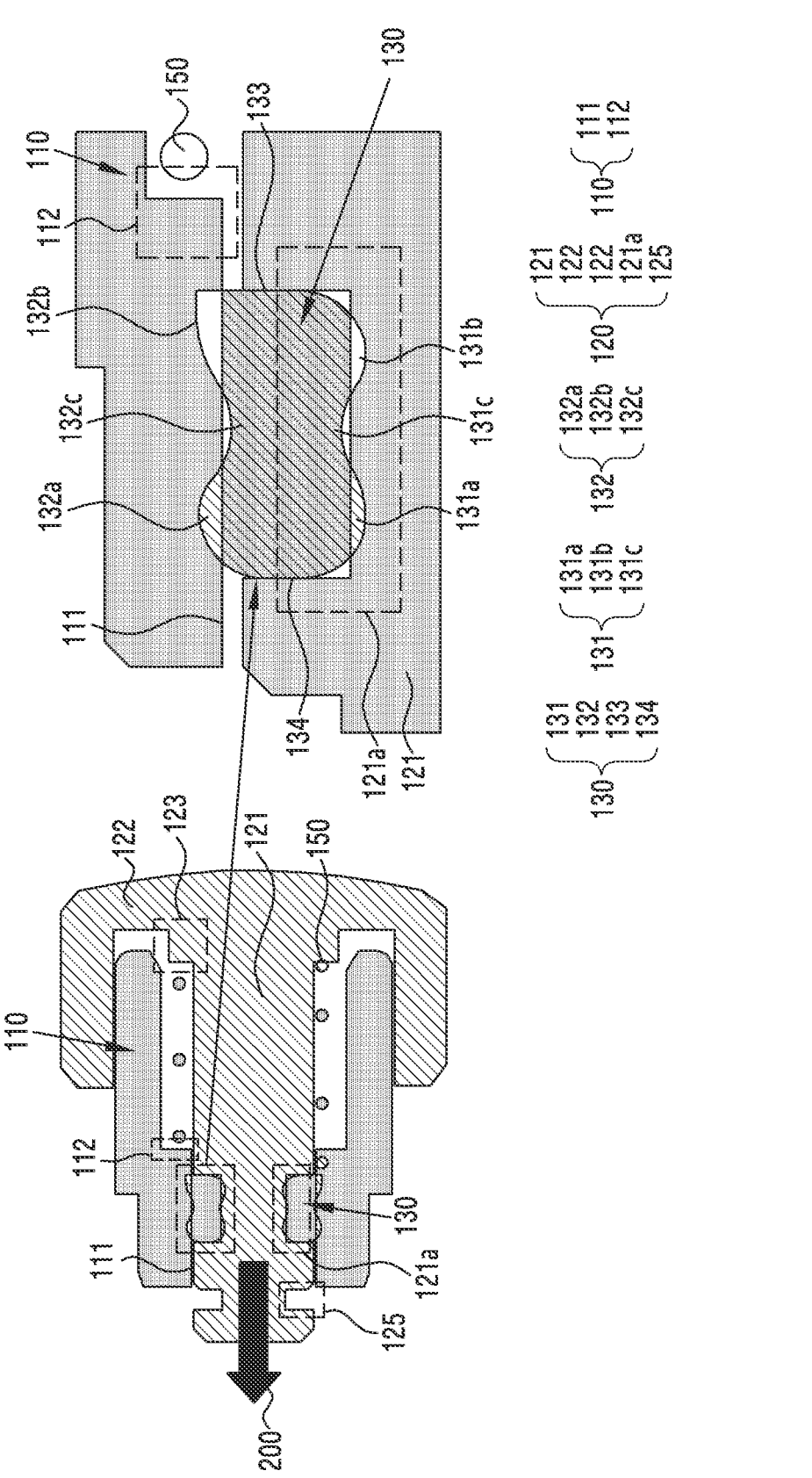
FIG. 11 is a cross-sectional view showing a configuration of an electronic device according to an embodiment of the disclosure.

FIG. 11 is a cross-sectional view showing a configuration of an electronic device according to an embodiment of the disclosure.

The structures of the body 110, the physical button 120, the waterproof member 130, and the elastic member 150 may refer to the structures of the electronic device 100 in FIG. 5. In connection with elements identical or substantially identical to the foregoing elements, the same terms or same reference numerals may be used, and overlapping descriptions may be omitted.

Referring to FIG. 11, a rod 121 may include a recessed groove 121*a* formed on a surface thereof facing a body 110 so as to accommodate at least a part of a waterproof member 130. The waterproof member 130 may be disposed such that a first convex surface 131*a* and a second convex surface 131*b* are in close contact with one surface of the recessed groove 121*a*, and a third convex surface 132*a* and a protruding surface 132*b* are in close contact with the one surface of the body 110. According to an embodiment, a lower surface 133 of the waterproof member 130 may be disposed to be in close contact with the other surface of the recessed groove 121*a*, and a fourth convex surface 134 may be disposed to be in close contact with one surface of the recessed groove 121*a*, which faces the other surface of the recessed groove. For example, an area, which is in close contact one surface of the recessed groove 121*a*, may be formed on the first convex surface 131*a* and the second convex surface 131*b*. The areas, which are in close contact therewith, may seal between the waterproof member 130 and the one surface of recessed groove 121*a* while maintaining a state of being pressed between the waterproof member 130 and the one surface of the recessed groove 121*a* by the elastic force thereof. In another example, areas, which are in close contact with the one surface of the body 110, may be formed on the third convex surface 132*a* and the protruding surface 132*b*. The areas, which are in close contact therewith, may seal between the waterproof member 130 and the one surface of the body 110 while maintaining a state of being pressed between the waterproof member 130 and the one surface of the body 110 by the elastic force of the waterproof member 130.

In an embodiment, the waterproof member 130 may be disposed such that the first concave surface 131*c* is formed to have a gap with one surface of the recessed groove 121*a*. A closed space may be formed between the first concave surface 131*c* and one surface of the recessed groove 121*a* by the first convex surface 131*a* and the second convex surface 131*b*. In another embodiment, the waterproof member 130 may be disposed such that the second concave surface 132*c* has a gap with one surface of the body 110. A closed space may be formed between the second concave surface 132*c* and the body 110 by the third convex surface 132*a* and the protruding surface 132*b*. In case that the waterproof member performs linear motion or linear reciprocating motion in the X-axis direction 200, the internal pressure of the closed space may increase. As the internal pressure increases, the closing force of the closed space may increase.

In yet another embodiment, one end of the elastic member 150 may be disposed on a step surface configuring a step 112 by which the diameter of the passage of the body 110 is enlarged, and the other end of the elastic member 150 may be disposed on one surface of the button part 122. In still another embodiment, the physical button 120 may further include a step surface having a step 123 formed on one end of the rod 121, on which the button part 122 and the rod 121 are in contact with each other. The step 123 may, for example, be formed so that the diameter of the rod is enlarged. One end of the elastic member 150 may be disposed on a step surface configuring the step 112 by which the diameter of the passage of the body 110 is enlarged, and the other end of the elastic member 150 may be disposed on one surface of a step surface of the step 123.

Various embodiments of the disclosure disclosed in the specification and the drawings are merely specific examples presented to easily describe the technical content of the disclosure and to help understanding of the disclosure, and are not intended to limit the scope of the disclosure. It should be interpreted that not only embodiments disclosed herein but also all changed or modified forms derived based on the technical idea of the disclosure are included in the scope of the disclosure.

As described above, an electronic device (e.g., the electronic device 100 in FIG. 1) according to an embodiment may include a body having a passage, a physical button including a rod extending through the passage, and a waterproof member including an inner surface which includes a first convex surface and a second convex surface formed to have a gap with the first convex surface, a penetration hole formed by the inner surface, an outer surface including a third convex surface and a protruding surface formed to have a gap with the third convex surface, a lower surface formed between the inner surface and the outer surface, and a fourth convex surface formed in a direction opposite to the lower surface, the waterproof member may be disposed between the body and the rod, and the rod may be inserted through the penetration hole, and the waterproof member may be disposed such that the first convex surface and the second convex surface are in close contact with the rod, and the third convex surface and the protruding surface are in close contact with one surface of the body.

According to one embodiment, the waterproof member may be configured such that the first convex surface is oriented in a direction opposite to the third convex surface, and the second convex surface is oriented in a direction opposite to the protruding surface.

According to another embodiment, the inner surface of the waterproof member may further include a first concave surface formed between the first convex surface and the second convex surface, and the outer surface may further include a second concave surface formed between the third convex surface and the protruding surface and formed in a direction opposite to the first concave surface.

According to still another embodiment, the waterproof member may be configured such that the first concave surface is connected to the first convex surface and the second convex surface through a curved surface, the second concave surface is connected to the third convex surface and the protruding surface through a curved surface, and the fourth convex surface is connected to the first convex surface and the third convex surface through a curved surface.

According to yet another embodiment, the waterproof member may be configured such that the first concave surface is disposed to have a gap with the rod so as to form a closed space between the rod and the waterproof member, and the second concave surface is disposed to have a gap with the one surface of the body so as to form a closed space between the one surface of the body and the waterproof member.

In an embodiment, the waterproof member may be configured such that the second convex surface is connected to the lower surface through a curved surface.

In another embodiment, the lower surface may include a flat surface orthogonal to a direction in which the rod is inserted.

In yet another embodiment, the passage may have an open end formed to opened to the outside of the electronic device, and may include a step surface configuring a step by which the diameter of the passage is enlarged in a direction toward the open end, and the waterproof member may be disposed such that the first convex surface and the second convex surface are in close contact with the rod, the third convex surface and the protruding surface are in close contact with the one surface of the body, and the fourth convex surface are in close contact with one surface of the step surface.

In still another embodiment, the electronic device may further include a washer including a hole through which the rod is inserted, and one surface facing the lower surface of the waterproof member, the washer may be disposed between the body and the rod and disposed such that the one surface thereof facing the lower surface is disposed to face the lower surface of the waterproof member, and the rod may be inserted through the penetration hole and the hole.

According to an embodiment, the electronic device may further include an elastic member disposed between the rod and the body, and the elastic member may have one end disposed on the other surface of the washer, and the other end disposed on one surface of the physical button.

According to another embodiment, the rod may include a step surface having a step which is formed on one end, which is in contact with the one surface of the physical button, of the rod, and by which the diameter of the rod is enlarged, and the elastic member may have one end disposed on the other surface of the washer, and the other end disposed on one surface of the step surface of the rod.

According to yet another embodiment, the passage may have an open end formed to be opened to the outside of the electronic device and may include a step surface configuring a step by which the diameter of the passage is enlarged in a direction toward the open end, the rod may have a recessed groove formed on a surface thereof facing the body so as to accommodate at least a part of the waterproof member, and the waterproof member may be disposed such that the first convex surface and the second convex surface are in close contact with one surface of the recessed groove, and the third convex surface and the protruding surface are in close contact with the one surface of the body.

According to still another embodiment, the electronic device may further include an elastic member disposed between the body and the rod, and the elastic member may have one end disposed on one surface of the step surface, and the other end disposed on one surface of the physical button.

In an embodiment, a parting line may be formed at the outermost part of the protruding surface along a boundary between the protruding surface and the lower surface.

In another embodiment, the electronic device may further include at least one fixation member disposed inside the electronic device, and the rod may have a recessed groove formed thereon so as to accommodate at least a part of the fixation member.

As described above, a waterproof member (e.g., the waterproof member 130 in FIG. 4) may, for example, include an inner surface which includes a first convex surface and a second convex surface formed to have a gap with the first convex surface, a penetration hole formed by the inner surface, an outer surface including a third convex surface and a protruding surface formed to have a gap with the third convex surface, a lower surface formed between the inner surface and the outer surface, and a fourth convex surface formed in a direction opposite to the lower surface.

According to an embodiment, the first convex surface may be formed in a direction opposite to the third convex surface, and the second convex surface may be formed in a direction opposite to the protruding surface.

According to another embodiment, the inner surface of the waterproof member may further include a first concave surface formed between the first convex surface and the second convex surface, and the outer surface may further include a second concave surface formed between the third convex surface and the protruding surface and formed in a direction opposite to the first concave surface.

According to yet another embodiment, the first concave surface may be connected to the first convex surface and the second convex surface through a curved surface, the second concave surface may be connected to the third convex surface and the protruding surface through a curved surface, and the fourth convex surface may be connected to the first convex surface and the third convex surface through a curved surface.

According to still another embodiment, a parting line may be formed at the outermost part of the protruding surface along a boundary between the protruding surface and the lower surface.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a body having a passage;
a physical button comprising a rod extending through the passage; and
a waterproof member comprising:
an inner surface which comprises a first convex surface, a second convex surface formed to have a gap with the first convex surface, and a first concave surface positioned between the first convex surface and the second convex surface,
a penetration hole formed by the inner surface,
an outer surface comprising a third convex surface, a protruding surface formed to have a gap with the third convex surface, and a second concave surface positioned between the third convex surface and the protruding surface,
a lower surface formed between the inner surface and the outer surface, and
a fourth convex surface formed in a direction opposite to the lower surface,
wherein the waterproof member is disposed between the body and the rod,
wherein the rod is inserted through the penetration hole,
wherein the waterproof member is disposed such that the first convex surface and the second convex surface are in close contact with the rod,
wherein the third convex surface and the protruding surface are in close contact with one surface of the body, and
wherein the first concave surface overlaps the second concave surface in a direction perpendicular to a direction in which the rod is inserted through the penetration hole.

2. The electronic device of claim 1,
wherein the waterproof member is configured such that the first convex surface is oriented in a direction opposite to the third convex surface, and
wherein the second convex surface is oriented in a direction opposite to the protruding surface.

3. The electronic device of claim 1,
wherein the inner surface of the waterproof member further comprises a first concave surface formed between the first convex surface and the second convex surface, and
wherein the outer surface further comprises a second concave surface formed between the third convex surface and the protruding surface and formed in a direction opposite to the first concave surface.

4. The electronic device of claim 3,
wherein the waterproof member is configured such that the first concave surface is connected to the first convex surface and the second convex surface through a curved surface,
wherein the second concave surface is connected to the third convex surface and the protruding surface through a curved surface, and
wherein the fourth convex surface is connected to the first convex surface and the third convex surface through a curved surface.

5. The electronic device of claim 3,
wherein the waterproof member is configured such that the first concave surface is disposed to have a gap with the rod so as to form a closed space between the rod and the waterproof member, and
wherein the second concave surface is disposed to have a gap with the one surface of the body so as to form a closed space between the one surface of the body and the waterproof member.

6. The electronic device of claim 1, wherein the waterproof member is configured such that the second convex surface is connected to the lower surface through a curved surface.

7. The electronic device of claim 1, wherein the lower surface comprises a flat surface orthogonal to a direction in which the rod is inserted.

8. The electronic device of claim 1,
wherein the passage has an open end formed to be opened to an outside of the electronic device, and comprises a step surface configuring a step by which a diameter of the passage is enlarged in a direction toward the open end,
wherein the waterproof member is disposed such that the first convex surface and the second convex surface are in close contact with the rod,
wherein the third convex surface and the protruding surface are in close contact with the one surface of the body, and
wherein the fourth convex surface are in close contact with one surface of the step surface.

9. The electronic device of claim 8, further comprising:
a washer comprising a hole through which the rod is inserted, and one surface facing the lower surface of the waterproof member,
wherein the washer is disposed between the body and the rod, and disposed such that one surface thereof facing the lower surface is disposed to face the lower surface of the waterproof member, and
wherein the rod is inserted through the penetration hole and the hole.

10. The electronic device of claim 9, further comprising:
an elastic member disposed between the rod and the body,
wherein the elastic member has one end disposed on the other surface of the washer, and
wherein the other end disposed on one surface of the physical button.

11. The electronic device of claim 10,
wherein the rod comprises a step surface having a step which is formed on one end, which is in contact with the one surface of the physical button, of the rod, and by which a diameter of the rod is enlarged,
wherein the elastic member has one end disposed on the other surface of the washer, and
wherein the other end disposed on one surface of the step surface of the rod.

12. The electronic device of claim 1, wherein the passage has an open end formed to be opened to an outside of the electronic device, and comprises a step surface configuring a step by which a diameter of the passage is enlarged in a direction toward the open end, wherein the rod has a recessed groove formed on a surface thereof facing the body so as to accommodate at least a part of the waterproof member, wherein the waterproof member is disposed such that the first convex surface and the second convex surface are in close contact with one surface of the recessed groove, and wherein the third convex surface and the protruding surface are in close contact with the one surface of the body.

13. The electronic device of claim 12, further comprising:

an elastic member disposed between the body and the rod, wherein the elastic member has one end disposed on one surface of the step surface, and wherein the other end disposed on one surface of the physical button.

14. The electronic device of claim 1, comprising a parting line formed at the outermost part of the protruding surface along a boundary between the protruding surface and the lower surface.

15. The electronic device of claim 1, further comprising:

at least one fixation member disposed inside the electronic device, wherein the rod has a recessed groove formed thereon so as to accommodate at least a part of the fixation member.

16. A waterproof member comprising:

an inner surface which comprises a first convex surface, a second convex surface formed to have a gap with the first convex surface, and a first concave surface positioned between the first convex surface and the second convex surface;

a penetration hole formed by the inner surface;

an outer surface comprising a third convex surface, a protruding surface formed to have a gap with the third convex surface, and a second concave surface positioned between the third convex surface and the protruding surface;

a lower surface formed between the inner surface and the outer surface; and a fourth convex surface formed in a direction opposite to the lower surface, wherein the first concave surface overlaps the second concave surface in a direction from the inner surface to the outer surface.

17. The waterproof member of claim 16, wherein the waterproof member is configured such that the first convex surface is oriented in a direction opposite to the third convex surface, and wherein the second convex surface is oriented in a direction opposite to the protruding surface.

18. The waterproof member of claim 16, wherein the inner surface of the waterproof member further comprises a first concave surface formed between the first convex surface and the second convex surface, and wherein the outer surface further comprises a second concave surface formed between the third convex surface and the protruding surface and formed in a direction opposite to the first concave surface.

19. The waterproof member of claim 18, wherein the waterproof member is configured such that the first concave surface is connected to the first convex surface and the second convex surface through a curved surface, wherein the second concave surface is connected to the third convex surface and the protruding surface through a curved surface, and wherein the fourth convex surface is connected to the first convex surface and the third convex surface through a curved surface.

20. The waterproof member of claim 16, further comprising:

a parting line formed at the outermost part of the protruding surface along a boundary between the protruding surface and the lower surface.

\* \* \* \* \*